United States Patent [19]

Murata

[11] Patent Number: 4,851,824

[45] Date of Patent: Jul. 25, 1989

[54] LIGHT EMITTING DIODE DISPLAY PANEL

[75] Inventor: Kazuhisa Murata, Nara, Japan

[73] Assignee: Sharp Kabushiki Kaisha, Osaka, Japan

[21] Appl. No.: 101,183

[22] Filed: Sep. 24, 1987

[30] Foreign Application Priority Data

Oct. 1, 1986 [JP] Japan .................. 61-151651[U]

[51] Int. Cl.⁴ ............................................. G09G 3/00
[52] U.S. Cl. .................... 340/701; 340/762; 340/782; 340/815.03; 340/815.1
[58] Field of Search ............ 340/701, 702, 703, 704, 340/762, 766, 782, 815.03, 815.1; 313/498, 500

[56] References Cited

U.S. PATENT DOCUMENTS 3,947,840  3/1976  Craford et al. .................. 340/782
4,271,408  6/1981  Teshima et al. ................. 340/782
4,445,132  4/1984  Ichikawa et al. ................ 340/782
4,580,133  4/1986  Matsuoka et al. ............... 340/782
4,723,119  2/1988  Morimoto ....................... 340/702

Primary Examiner—David K. Moore
Assistant Examiner—Jeffery A. Brier
Attorney, Agent, or Firm—Flehr, Hohbach, Test, Albritton & Herbert

[57] ABSTRACT

Each of many two-color light emitting diode elements which make up a display panel includes two light emitting diode chips emitting light of different colors. These elements are so arranged in the panel that chips emitting light of the same color are adjacent to each other in the direction along which two chips in each of these elements are aligned and that chips emitting light of different colors are alternately aligned along the direction perpendicular thereto.

10 Claims, 2 Drawing Sheets

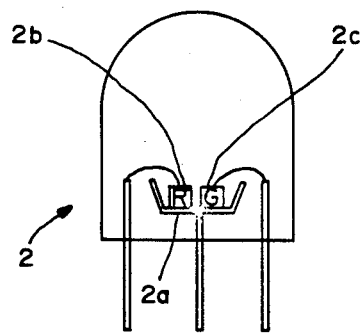
FIG.—4
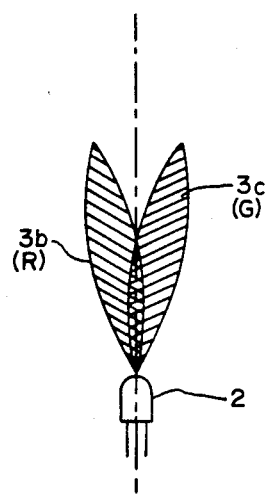
FIG.—5
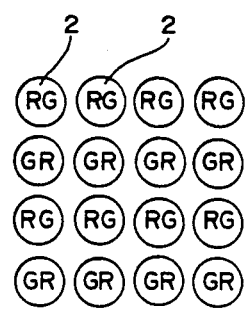
FIG.—6

LIGHT EMITTING DIODE DISPLAY PANEL

BACKGROUND OF THE INVENTION

This invention relates to a light emitting diode display panel composed of a plurality of light emitting diode elements.

As shown in FIG. 3, prior art display panels using light emitting diodes are typically composed of red (R) and green (G) light emitting diodes each including a stem of 3–5 mm Φ in outer diameter and disposed alternately in arrays such that mixed colors can be displayed. With a display panel thus structured, however, only a low brightness can be obtained because the number of light emitting diodes that can be disposed per unit area is limited by their external dimensions. In order to improve the brightness of a display panel, therefore, it may be considered to make use of two-color light emitting diode elements 2 structured as shown in FIG. 4 with two light emitting diode chips 2b and 2c on a single stem 2a emitting light of different colors such as red from one 2b and green from the other 2c. With two-color light emitting diode elements 2 like this, the number of light emitting diode chips per unit area of a display panel can be doubled and hence brighter panels can be made available.

Since the individual chips 2b and 2c of a two-color light emitting diode element 2 are disposed on the stem 2a away from the optical axis of the element 2 as shown in FIG. 4, however, red light and green light are emitted in mutually different directions as shown in FIG. 5 wherein numeral 3b indicates the directional intensity distribution of red light from the red light emitting diode chip 2b of FIG. 4 and numeral 3c indicates that of green light from the green light emitting diode elements like this are arranged as shown in FIG. 6 such that mutually adjacent chips emit different colors, different colors will be seen, depending upon the position of the viewers with respect to the panel. The view from the right-hand side or left-hand side, for example, will see different colors alternately along vertical lines.

SUMMARY OF THE INVENTION

It is therefore an object of the present invention to provide a light emitting diode display panel of high brightness from which the color or emitted light does not appear differently, depending on the angle at which it is viewed.

The above and other objects of the present invention are achieved by providing a light emitting diode display panel wherein two-color light emitting diode elements are disposed in matrix formation such that light emitting diode chips of the same color are adjacent to each other in the direction in which two-color light emitting diode chips are aligned but chips of different colors are mutually adjacent along the perpendicular direction. With a light emitting diode display panel thus structured, improved brightness can be obtained and the color of emitted light does not appear differently, depending on the angular position of the viewer with respect to the panel.

BRIEF DESCRIPTION OF THE DRAWINGS

The accompanying drawings, which are incorporated in and form a part of this specification, illustrate embodiments of the present invention and, together with the description, serve to explain the principles of the invention. In the drawings:

FIG. 4 is a sectional view of a two-color light emitting diode element for showing its structures schematically;

FIG. 5 is a schematic drawing of distribution of light intensity from the element of FIG. 4; and FIG. 6 is a drawing showing another arrangement of two-color light emitting diodes to be compared with that shown in FIG. 1.

DETAILED DESCRIPTION OF THE INVENTION

Figure 1:
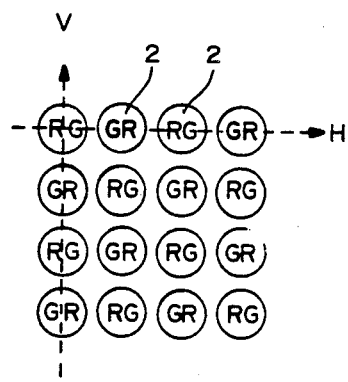
FIG. 1 is a drawing showing the arrangement of two-color light emitting diodes according to the present invention.

FIG. 1 shows an arrangement of two-color light emitting diode elements 2 according to the present invention. The structure and light-emission characteristics of the elements 2 are as explained above by way of FIGS. 4 and 5.

The arrangement shown in FIG. 1 is characterized in that two light emitting diode chips of the same color (red (R) or green (G)) are adjacent each other in the direction indicated by H along which the two light emitting diode chips in each element 2 are aligned and that two light emitting diode chips of different colors are adjacent each other in the perpendicular direction indicated by V. With an arrangement as described above, one can realize a display panel with improved brightness from which the color of emitted light does not appear to change, depending on the angular position of the viewer and with which intermediate colors can be beautifully displayed when seen from a distance.

Figure 2:
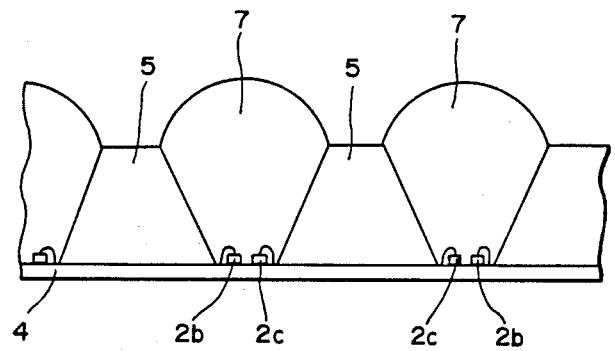
FIG. 2 is a schematic sectional view of a display panel according to another embodiment of the present invention.
Figure 3:
FIG. 3 is a drawing showing the arrangement of light emitting diodes in a prior art display panel.

The foregoing description of a preferred embodiment of the invention has been presented for purposes of illustration and description. It is not intended to be exhaustive or to limit the invention to the precise form disclosed, and many modifications and variations are possible in light of the above teaching. For example, FIG. 4 is not intended to limit the type of two-color light emitting diodes in a display panel of the present invention. Also included within the scope of the present invention are two-color light emitting diode elements of wich the chip of each color comprises a pair, each pair having common directionality. FIG. 2 shows still another kind of two-color light emitting diode element within the scope of this invention, having pairs of two-color chips 2b and 2c disposed on a substrate 4, a reflecting plate 5 provided to cover it with a V-shaped holes 6 each corresponding to a pair of these chips 2b and 2c, and a transparent resin material 7 molded in these holes 6. In other words, these types of two-color light emitting diode elements may also be arranged as shown in FIG. 1 to achieve the objects of the present invention.

What is claimed is:

1. A light emitting diode display panel comprising a plurality of two-color light emitting diode elements each having on one stem two light emitting diode chips which emit light of different colors, said two-color light emitting diode elements being so arranged that chips emitting light of the same color are adjacent each other in the direction along which two chips in each of said elements are aligned and that chips emitting light of different colors are alternately aligned along the perpendicular direction.

2. The display panel of claim 1 wherein said different colors are red and green.

3. The display panel of claim 1 wherein said two-color light emitting diode elements are arranged in a matrix formation along said first and second directions.

4. The display panel of claim 3 wherein each pair of said chips emitting light of a same color and mutually adjacent to each other in said first direction is in two of said elements which are mutually adjacent to each other in said first direction.

5. A light emitting diode display panel comprising a plurality of two-color light emitting diode elements arranged on a substrate in a matrix formation along mutually perpendicular first and second directions, each of said two-color light emitting diode elements having two light emitting diode chips which emit light of different colors and are aligned in said first direction with respect to each other, said two-color light emitting diode elements being so arranged that two of said chips emitting light of the same color are adjacent each other in said first direction and that those of said chips emitting different colors are alternately aligned along said second direction.

6. The display panel of claim 5 further comprising a reflecting plate having holes, said reflecting plate covering said substrate, said holes corresponding individually to said light emitting diode elements and being filled with a transparent resin material.

7. The display panel of claim 6 wherein said holes are V-shaped.

8. A light emitting diode display panel comprising a plurality of two-color light emitting diode chips which emit light of different colors and are aligned in a first direction with respect to each other, said two-color light emitting diode elements being so arranged that each pair of said chips mutually adjacent in said first direction and in mutually adjacent ones of said elements emits light of a same color and that each group of said chips aligned along a second direction which is perpendicular to said first direction emits alternately different colors.

9. The display panel of claim 8 wherein said elements are arranged in a matrix form along said first and second directions.

10. The display panel of claim 8 wherein said different colors are green and red.

* * * * *

UNITED STATES PATENT AND TRADEMARK OFFICE
CERTIFICATE OF CORRECTION

PATENT NO. : 4,851,824
DATED : July 25, 1989
INVENTOR(S) : Murata

It is certified that error appears in the above—identified patent and that said Letters Patent is hereby corrected as shown below:

claim 8, ln. 11, after the word "diode" please add --elements each having on one stem two light emitting diode--.

Signed and Sealed this

Seventeenth Day of July, 1990

Attest:

HARRY F. MANBECK, JR.

*Attesting Officer*      *Commissioner of Patents and Trademarks*